(12) United States Patent
Ramin et al.

(10) Patent No.: US 8,802,519 B2
(45) Date of Patent: Aug. 12, 2014

(54) WORK FUNCTION ADJUSTMENT WITH THE IMPLANT OF LANTHANIDES

(71) Applicant: Texas Instruments Incorporated, Dallas, TX (US)

(72) Inventors: Manfred Ramin, Freising (DE); Michael F. Pas, Richardson, TX (US); Husam N. Alshareef, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/855,457

(22) Filed: Apr. 2, 2013

(65) Prior Publication Data

US 2013/0224940 A1     Aug. 29, 2013

Related U.S. Application Data

(60) Continuation of application No. 12/979,908, filed on Dec. 28, 2010, now Pat. No. 8,409,943, which is a continuation of application No. 11/737,856, filed on Apr. 20, 2007, now Pat. No. 7,858,459, and a continuation-in-part of application No. 12/965,528, filed on Dec. 10, 2010, which is a continuation of application No. 12/255,500, filed on Oct. 21, 2008, now abandoned, which is a division of application No. 11/694,662, filed on Mar. 30, 2007, now abandoned, said application No. 12/979,908 is a continuation-in-part of application No. 11/590,133, filed on Oct. 31, 2006, now Pat. No. 8,304,342, and a continuation-in-part of application No. 12/886,863, filed on Sep. 21, 2010, now Pat. No. 8,304,333, which is a division of application No. 11/741,476, filed on Apr. 27, 2007, now Pat. No. 7,799,669, said application No. 12/979,908 is a continuation-in-part of application No. 12/731,900, filed on Mar. 25, 2010, now Pat. No. 8,114,728, which is a division of application No. 11/934,250, filed on Nov. 2, 2007.

(51) Int. Cl.
*H01L 21/336* (2006.01)

(52) U.S. Cl.
USPC ...................................... 438/197

(58) Field of Classification Search
USPC ...................................... 438/197
See application file for complete search history.

(56) References Cited

U.S. PATENT DOCUMENTS

| | | | |
|---|---|---|---|
| 4,494,996 A | 1/1985 | Ohno et al. | |
| 6,982,230 B2 | 1/2006 | Cabral et al. | |
| 7,105,886 B2 | 9/2006 | Droopad | |
| 2006/0286802 A1 | 12/2006 | Yu et al. | |
| 2007/0218623 A1 | 9/2007 | Chua et al. | |
| 2008/0124907 A1* | 5/2008 | Forbes et al. | 438/587 |
| 2008/0224239 A1* | 9/2008 | Lin et al. | 257/411 |

* cited by examiner

*Primary Examiner* — David Vu
*Assistant Examiner* — Brandon Fox
(74) *Attorney, Agent, or Firm* — Jacqueline J. Garner; Frederick J Telecky, Jr.

(57) ABSTRACT

Semiconductor devices and fabrication methods are provided, in which fully silicided gates are provided. A lanthanide series metal is implanted into the gate electrode layer prior to silicidation and diffuses into the gate dielectric during an activation anneal. This process and resultant structure provides adjustment of the gate electrode work function, thereby tuning the threshold voltage of the resulting transistor.

3 Claims, 5 Drawing Sheets

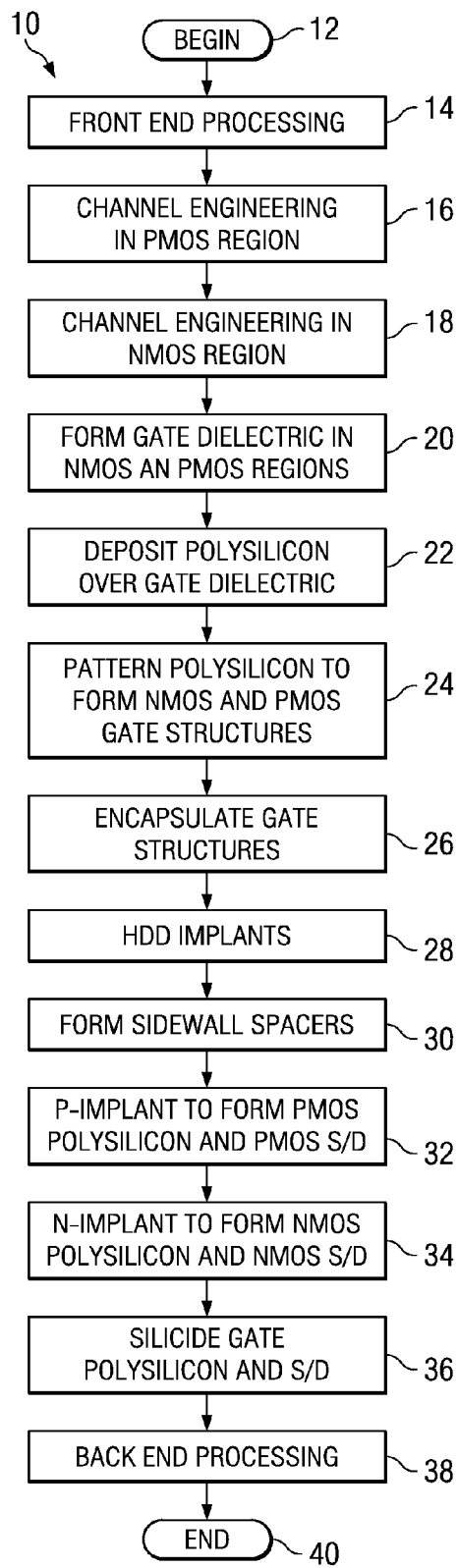
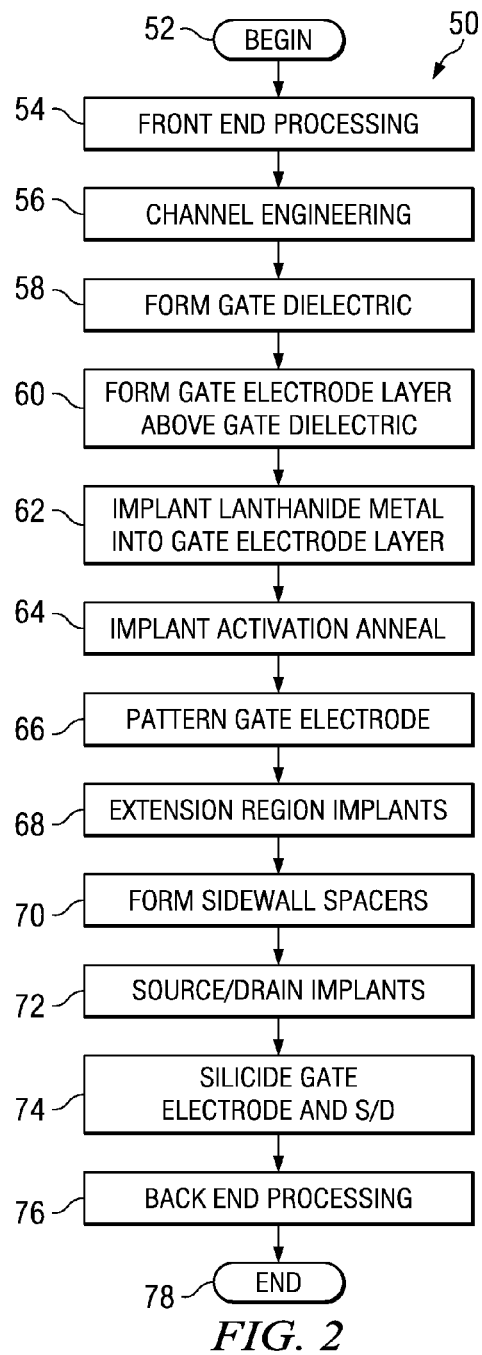
FIG. 1 (PRIOR ART)
FIG. 2

WORK FUNCTION ADJUSTMENT WITH THE IMPLANT OF LANTHANIDES

CROSS-REFERENCE TO RELATED APPLICATIONS

This application is a continuation of application Ser. No. 12/979,908, filed Dec. 28, 2010 (now U.S. Pat. No. 8,409,943).

application Ser. No. 12/979,908 is a continuation of application Ser. No. 11/737,856 filed Apr. 20, 2007, now U.S. Pat. No. 7,858,459.

application Ser. No. 12/979,908 is a continuation-in-part of application Ser. No. 12/965,528 filed Dec. 10, 2010, which is a continuation of application Ser. No. 12/255,500 filed Oct. 21, 2008, which is a division of application Ser. No. 11/694,662 filed Mar. 30, 2007.

application Ser. No. 12/979,908 is a continuation-in-part of application Ser. No. 11/590,133 filed Oct. 31, 2006.

application Ser. No. 12/979,908 is a continuation-in-part of application Ser. No. 12/886,863 filed Sep. 21, 2010, which is a division of application Ser. No. 11/741,476 filed Apr. 27, 2007.

application Ser. No. 12/979,908 is a continuation-in-part of application Ser. No. 12/731,900 filed Mar. 25, 2010, which is a division of application Ser. No. 11/934,250 filed Nov. 2, 2007.

The entireties of all of the above applications are hereby incorporated by reference.

BACKGROUND OF THE INVENTION

The present invention relates generally to semiconductor devices and more particularly to NMOS transistor devices and fabrication methods for making the same.

Field effect transistors (FETs) are widely used in the electronics industry for switching, amplification, filtering, and other tasks related to both analog and digital electrical signals. Most common among these are metal oxide semiconductor field effect transistors (MOSFETs), wherein a gate electrode is energized to create an electric field in a channel region of a semiconductor body, by which electrons are allowed to travel through the channel between a source region and a drain region of the semiconductor body. The source and drain regions are typically formed by adding dopants to targeted regions on either side of the channel. A gate dielectric or gate oxide is formed over the channel, and a gate electrode or gate contact is formed over the gate dielectric. The gate dielectric and gate electrode layers are then patterned to form a gate structure overlying the channel region of the substrate.

In operation of the resulting MOS transistor, the threshold voltage (Vt) is the gate voltage value required to render the channel conductive by formation of an inversion layer at the surface of the semiconductor channel. Complimentary MOS (CMOS) devices have become widely used in the semiconductor industry, wherein both n-channel and p-channel (NMOS and PMOS) transistors are used to fabricate logic and other circuitry. For enhancement-mode (e.g., normally off) devices, the threshold voltage Vt is positive for NMOS and negative for PMOS transistors. The threshold voltage is dependent upon the flat-band voltage, where the flat-band voltage depends on the work function difference between the gate and the substrate materials, as well as on surface charge.

The work function of a material is a measure of the energy required to move an electron in the material outside of a material atom from the Fermi level, and is usually expressed in electron volts (eV). For CMOS products, it is desirable to provide predictable, repeatable, and stable threshold voltages (Vt) for the NMOS and PMOS transistors. To establish Vt values, the work functions of the PMOS and NMOS gate contact and the corresponding channel materials are independently tuned or adjusted through gate and channel engineering, respectively.

Gate stack engineering is employed to adjust the work function of the gate contact materials, where different gate work function values are set for PMOS and NMOS gates. The need to independently adjust PMOS and NMOS gate work functions has made polysilicon attractive for use as a gate contact material in CMOS processes, since the work function of polysilicon can be easily raised or lowered by doping the polysilicon with p-type or n-type impurities, respectively. The PMOS polysilicon gates are typically doped with p-type impurities and NMOS gate polysilicon is doped with n-type dopants, typically during implantation of the respective source/drain regions following gate patterning. In this way, the final gate work functions are typically near the Si conduction band edge for NMOS and near the valence band edge for PMOS. The provision of dopants into the polysilicon also has the benefit of increasing the conductivity of the gate electrode. Polysilicon has thus far been widely used in the fabrication of CMOS devices, wherein the gate engineering provides a desired gate electrode conductivity (e.g., sheet resistance value) by conventional tuning (e.g., implants), and the threshold voltage fine tuning is achieved by tailoring the channel doping level through the Vt adjust implants.

FIG. 1 illustrates a conventional CMOS fabrication process 10 beginning at 12, in which front end processing is performed at 14, including well formation and isolation processing. At 16 and 18, channel engineering is performed (e.g., Vt adjust, punch-thru, and channel stop implants) for PMOS and NMOS regions, respectively. A thin gate dielectric and an overlying polysilicon layer are formed at 20 and 22, respectively, and the polysilicon is patterned at 24 to form gate structures for the prospective NMOS and PMOS transistors. The gate structures are then encapsulated at 26, typically through oxidation, and highly-doped drain (HDD) implants are performed at 28 to provide p-type dopants to prospective source/drains of the PMOS regions and n-type dopants to source/drains of the NMOS regions, using the patterned gate structures and isolation structures as an implantation mask. Sidewall spacers are then formed at 30 along the lateral sidewalls of the gate structures.

At 32, the PMOS source/drain regions and the PMOS polysilicon gate structures are implanted with p-type dopants to further define the PMOS source/drains, and to render the PMOS gates conductive. Similarly, the NMOS source/drain regions and the NMOS polysilicon gate structures are implanted at 34 with n-type dopants, further defining the NMOS source/drains and rendering the NMOS gates conductive. Thereafter, the source/drains and gates are silicided at 36 and back end processing (e.g., interconnect metalization, etc.) is performed at 38, before the process 10 ends at 40. In the conventional process 10, the channel engineering implants at 16 and 18 shift the Vt of the PMOS and NMOS channel regions, respectively, to compensate for the changes in the PMOS and NMOS polysilicon gate work functions resulting from the source/drain implants at 32 and 34, respectively. In this manner, the desired work function difference between the gates and channels may be achieved for the resulting PMOS and NMOS transistors, and hence the desired threshold voltages.

The gate dielectric or gate oxide between the channel and the gate electrode is an insulator material, typically $SiO_2$, nitrided $SiO_2$, or other dielectric, that operates to prevent current from flowing from the gate electrode into the channel when a voltage is applied to the gate electrode. The gate dielectric also allows an applied gate voltage to establish an electric field in the channel region in a controllable manner. Continuing trends in semiconductor product manufacturing include reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate dielectric that is formed over the semiconductor surface.

However, there are electrical and physical limitations on the extent to which SiO2 gate dielectrics can be made more thin. These include gate leakage currents tunneling through the thin gate oxide, limitations on the ability to form very thin oxide films with uniform thickness, and the inability of very thin SiO2 gate dielectric layers to prevent dopant diffusion from the gate polysilicon into the underlying channel. Accordingly, recent scaling efforts have focused on high-k dielectric materials having dielectric constants greater than that of SiO2, which can be formed in a thicker layer than scaled SiO2, and yet which produce equivalent field effect performance. A thicker high-k dielectric layer can thus be formed to avoid or mitigate tunneling leakage currents, while still achieving the required electrical performance equivalent (e.g., capacitance value) to a thinner SiO2.

It has also been proposed to utilize hafnium-based high-k dielectric materials in combination with a lanthanide series metal to lower the work function of metal gates. The lanthanide series metal is provided as a distinct surface layer over the high-k dielectric material. This proposal, however, may decrease the overall equivalent oxide thickness (EOT) of the layer of gate oxide.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In one embodiment, the invention is directed to a method of fabricating a transistor, the method comprising forming a gate dielectric over a semiconductor body. A gate electrode is formed over the gate dielectric, and a lanthanide series material is introduced into the gate electrode. The lanthanide series material is then driven subsequently into the gate dielectric from the gate electrode. Lastly, source/drain regions are formed in the semiconductor body on opposing sides of the gate, thereby defining a channel region therebetween. In one embodiment, the gate electrode is a silicon material, in which case, a silicidation may then be employed, for example, fully siliciding the gate electrode.

In another embodiment of the invention, a transistor formation method comprises forming a gate dielectric that contains a lanthanide series material over a semiconductor body. A silicon based gate electrode is then formed over the gate dielectric, followed by the formation of source/drain regions in the semiconductor body on opposing sides of the gate electrode. In one embodiment, the gate dielectric comprises a high-k dielectric material. In another embodiment, the gate dielectric comprises a silicon oxide interface layer, with a high-k dielectric formed thereover. The lanthanide series material, in such an example, extends throughout the high-k dielectric and does not extend into the silicon oxide interface layer.

According to yet another embodiment of the invention, a transistor structure is provided, wherein a gate dielectric material containing a lanthanide series material resides over a semiconductor body. The lanthanide series material in the gate dielectric resides in a top portion thereof and does not extend down to the interface of the gate dielectric and the semiconductor body. The transistor further includes a silicon based gate electrode overlying the gate electrode. Source/drain regions reside in the semiconductor body on opposing sides of the gate. In another embodiment, the silicon based gate electrode is silicided, for example, fully silicided with nickel.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIG. 1 (Prior Art) is a simplified flow diagram illustrating a conventional polysilicon gate CMOS fabrication process including channel engineering for both PMOS and NMOS transistors;

FIG. 2 is a flow diagram illustrating an exemplary method of fabricating a transistor in accordance with an aspect of the present invention;

DETAILED DESCRIPTION OF THE INVENTION

Figure 3A:
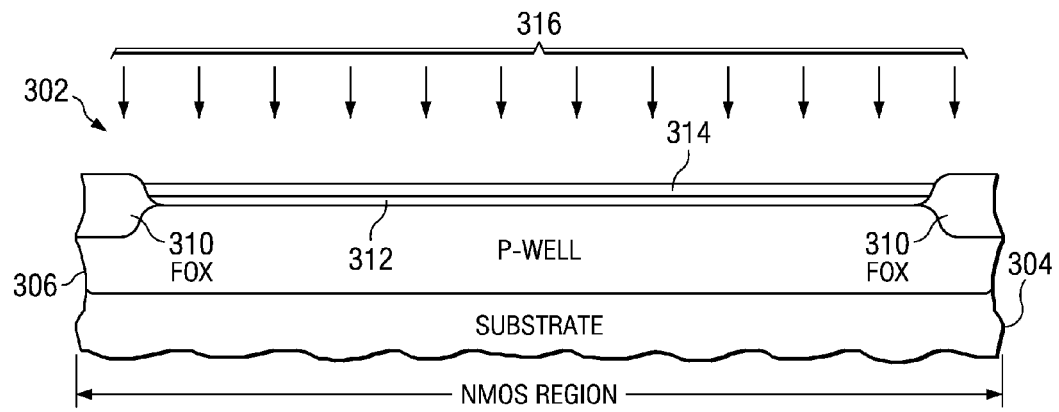
FIGS. 3A-3F are partial side elevation views in section illustrating an exemplary transistor undergoing processing in accordance with an embodiment of the invention at various stages of fabrication.

One or more implementations of the present invention will now be described with reference to the attached drawings, wherein like reference numerals are used to refer to like elements throughout, and wherein the illustrated structures are not necessarily drawn to scale. The invention relates to a method and related transistor device. In one embodiment of the invention, a lanthanide series material is incorporated into a top portion of a gate dielectric, and a silicon based gate electrode is formed thereover. In another embodiment of the invention, the gate electrode is fully silicided, for example, with a nickel silicide. The incorporation of the lanthanide series material into the gate dielectric advantageously provides for a reduction in the work function in an NMOS type transistor device.

Figure 3B:
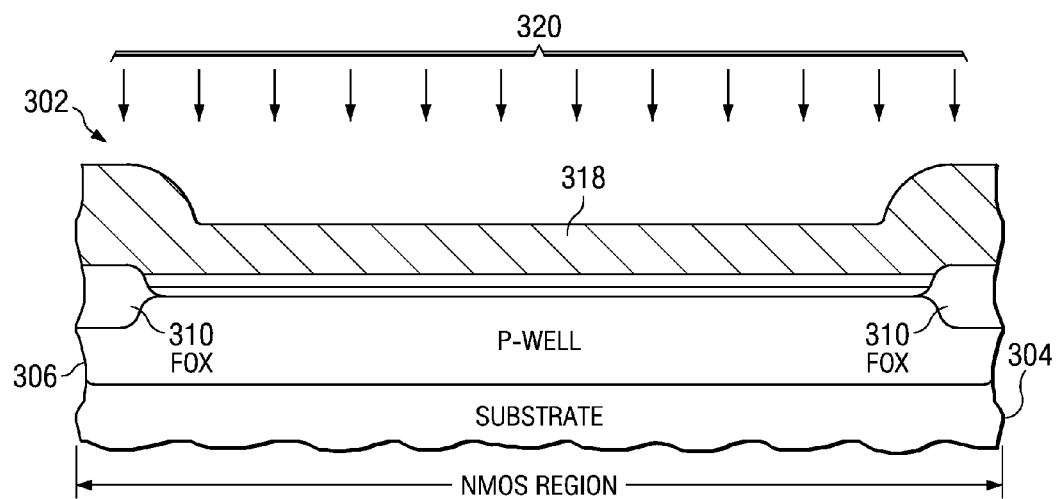
Figure 3C:
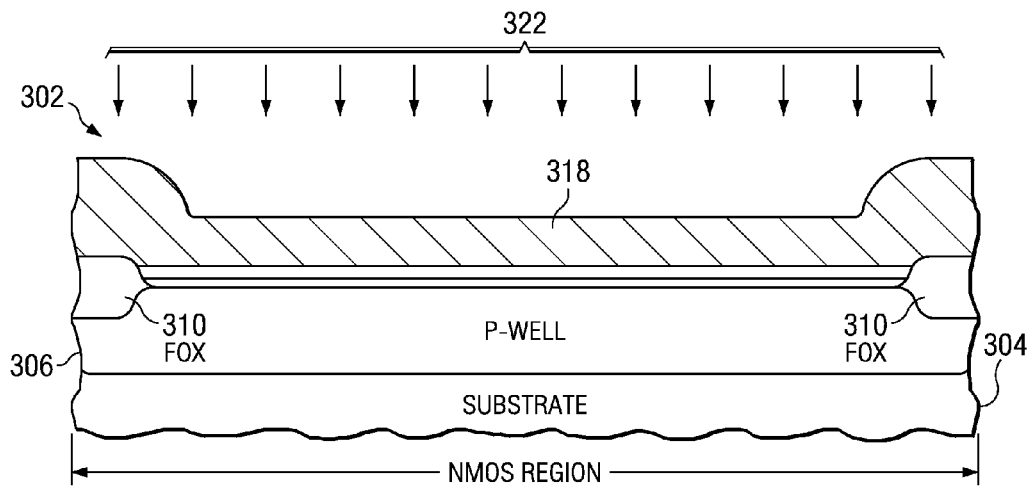
Figure 3D:
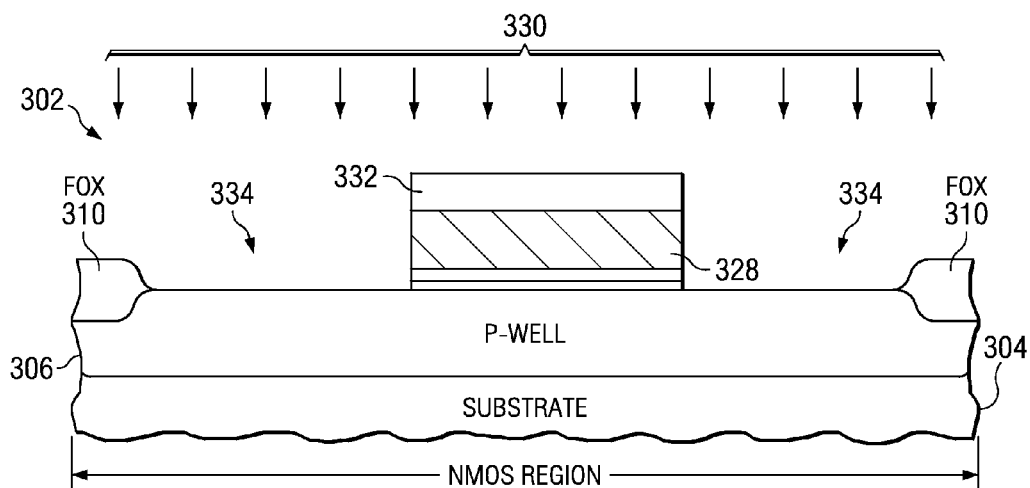
Figure 3E:
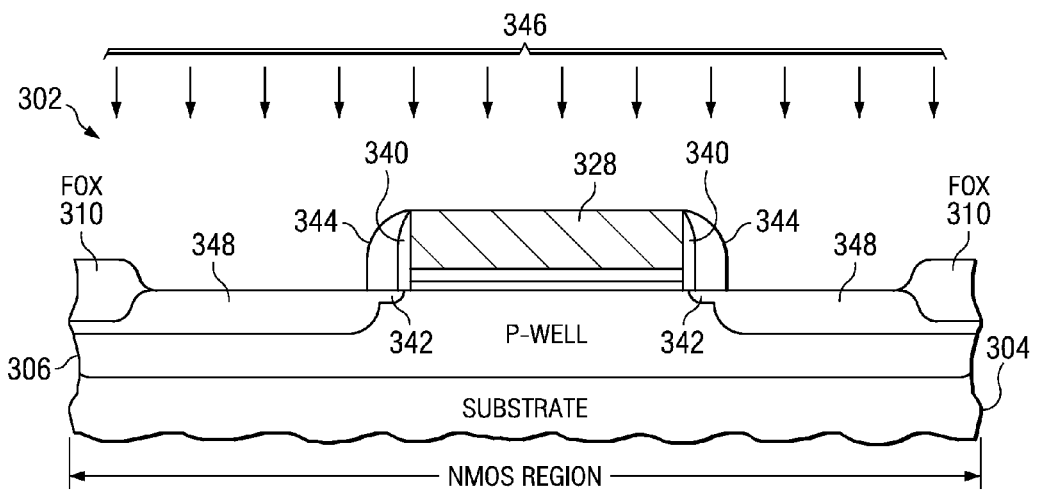
Figure 3F:
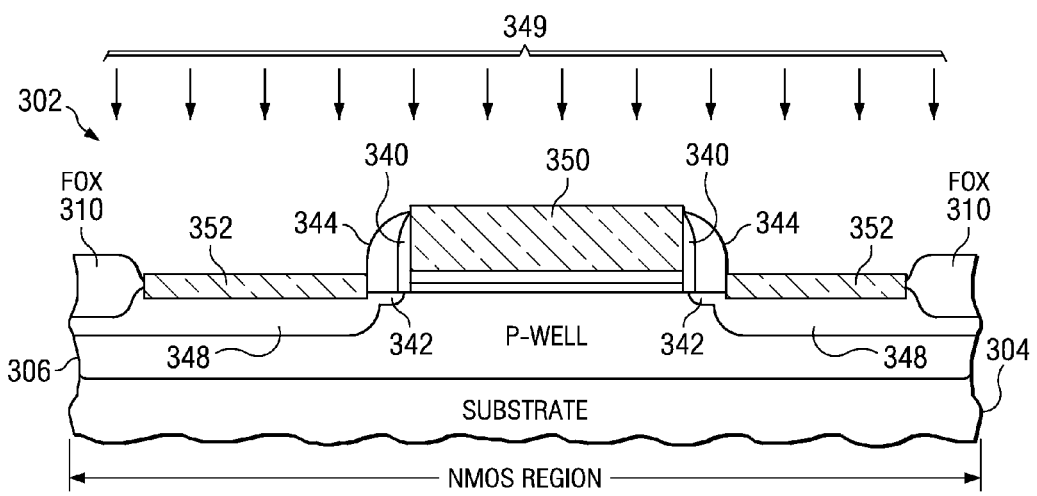

Referring initially to FIGS. 2-3F, an exemplary method 50 is illustrated in FIG. 2 for fabricating a transistor structure for an NMOS transistor, for example, in accordance with one embodiment of the present invention. FIGS. 3A-3F illustrate various exemplary implementations of portions of the method 50 relating to creation of a transistor with a reduced work function. While the exemplary method 50 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Further, the methods according to the present invention may be implemented in association with the formation and/or processing of structures illustrated and described herein as well as in association with other structures and devices not illustrated.

The method 50 begins at 52 in FIG. 2, wherein front end processing is performed at 54. Any front end processing may be performed within the scope of the invention, wherein the processing at 54 may include, for example, formation of n and p wells using diffusion, implantation, or other suitable processing steps, as well as formation of isolation structures in field regions of a device wafer using LOCOS, STI, or any suitable isolation processing. While the figures provided show use of LOCOS type field-oxide (FOX), type isolation structures, shallow trench isolation (STI) or other type isolation structures may also be employed and are contemplated by the present invention. The methods and devices of the invention may be implemented using any type of semiconductor body, including but not limited to bulk semiconductor wafers (e.g., silicon), epitaxial layers formed over a bulk semiconductor, SOI wafers, etc. At 56 channel engineering may be performed, for example, threshold voltage adjustment implants, punch-through implants, etc.

At 58, a gate dielectric is formed in an NMOS region using any suitable materials, material thicknesses, and processing steps, including a single thermal oxidation or deposition or combinations thereof to form a gate dielectric above the semiconductor body, which may be a single layer or multiple layers. The invention may be employed in conjunction with gate dielectric materials formed from nitrided SiO2, high-k dielectrics, including but not limited to binary metal oxides including aluminum oxide (Al2O3), zirconium oxide (ZrO2), hafnium oxide (HfO2), lanthanide oxides (e.g., La2O3, Yb2O3), yttrium oxide (Y2O3), titanium oxide (TiO2), as well as their silicates and aluminates; metal oxynitrides including aluminum oxynitride (AlON), zirconium oxynitride (ZrON), hafnium oxynitride (HfON), lanthanide oxynitrides (e.g., LaON, YbON), yttrium oxynitride (YON), as well as their silicates and aluminates such as ZrSiON, HfSiON, LaSiON, YSiON, etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and bi-layered perovskite system material such as strontium bismuth tantalate, bismuth titanate and others.

In the examples illustrated and described herein, a single thermal oxidation is performed at 58 to create a thin gate dielectric oxide (e.g., a thermally grown silicon oxide) overlying the substrate in the NMOS region, followed by the formation of a high-k dielectric material thereover. In one embodiment of the invention, the high-k dielectric material comprises HfSiON and is formed by chemical vapor deposition (CVD) or ALD. Referring briefly to FIG. 3A as one illuminating example, an NMOS device area 302 includes a p-type substrate 304, in which a p-type well 306 is formed. The active area or moat region is defined in this example as the region between the field-oxide isolation regions 310. A thin oxide interface layer 312 and a high-k dielectric layer 314 disposed thereover are illustrated as formed by a deposition process 316.

Following gate dielectric formation at 58, the method 50 provides for gate fabrication indicated generally at 60, wherein FIG. 3B illustrates the general gate electrode layer deposition at 320. In one embodiment of the invention, the gate electrode layer 318 comprises a silicon based gate electrode. In one embodiment, the gate electrode layer comprises an amorphous silicon layer, and in another embodiment the gate electrode comprises a polysilicon layer. Such layers may be formed via a CVD process, wherein for an amorphous layer a lower temperature of about 520 C, for example, is employed, while for a polysilicon layer a higher temperature of about 650 C, for example, is employed. In one example, the polysilicon or amorphous silicon layer has a thickness of about 800 Angstroms.

According to one embodiment of the invention, the method 50 of FIG. 2 continues at 62 with an implant of a lanthanide series metal into the gate electrode layer, as illustrated in FIG. 3C at 322. Any suitable implantation techniques and operational settings may be employed. The implant species comprises a lanthanide series metal and can include one or more of lanthanum, cerium, praseodymium, neodymium, promethium, samarium, europium, gadolinium, terbium, dysprosium, holmium, erbium, thulium, ytterbium, lutetium, or hafnium. While hafnium is not an actual lanthanide series element, for purposes of the present invention, hafnium is included herein. In one embodiment of the invention, the implant energy is selected to be sufficient to drive dopant down near a bottom interface of the gate electrode and the underlying gate dielectric, without such dopant reaching the gate dielectric during the implant.

In one embodiment of the invention, the doping of the gate electrode with the lanthanide series metal occurs in the NMOS region of the device, but not in the PMOS region. One way in which such a process may be implemented is by forming an implant mask over the PMOS region prior to the implant at 62. This may be performed so that the lanthanide series metal will operate to lower the work function in the resulting NMOS device in the NMOS region, and not impact the PMOS devices in the PMOS region, since the PMOS work function typically is not affected, or alternatively actions are taken to increase the PMOS device work function.

In one embodiment of the invention, the gate electrode layer may also be implanted with oxygen, wherein the oxygen may operate to reduce a diffusion coefficient associated with the lanthanide series material in any subsequent anneal processes.

The method 50 then continues at 64 of FIG. 2 with an activation anneal that operates to activate the lanthanide series material into the gate dielectric. In one embodiment of the invention, the activation anneal comprises a spike anneal of short duration (e.g., 3 seconds or less) at a relatively high temperature (e.g., about 1060 C). The activation anneal serves to cause at least some of the lanthanide series material to diffuse from the overlying gate electrode layer 318 down into the gate dielectric layer 314. In one embodiment of the invention, the activation anneal parameters are tailored to facilitate the lanthanide series material to diffuse into a top portion of the gate dielectric, but not down to the interface of the gate dielectric and the semiconductor body. For example, in one embodiment of the invention the lanthanide series material diffuses into the high-k dielectric layer 314, but not down into the underlying interface dielectric layer 312 illustrated in FIG. 3C.

In yet another embodiment of the invention, the activation anneal may be performed with an ambient gas mixture comprising at least oxygen and nitrogen, wherein the oxygen may operate to reduce an amount of diffusion of the lanthanide series material during the anneal process.

While in the above example the lanthanide series metal was introduced into the gate electrode by way of ion implantation, it should be understood that any manner of introducing such material therein may be employed and is contemplated as falling within the scope of the present invention. For example, one alternative manner may dope the silicon gate electrode material in-situ during the chemical vapor deposition of the silicon gate material. In such an example, the gate electrode material may be deposited and then subsequently removed in the PMOS regions, followed by another gate electrode layer deposition for the PMOS regions.

Reaction of the implanted lanthanide series metal with the gate dielectric provides for a downward adjustment of the material work function, thereby tuning the threshold voltage of the resulting NMOS transistor. In one embodiment, the resultant work function of the finished NMOS device is reduced to about 4.1 eV.

The gate electrode layer is then patterned at 66 to form the actual gate electrode, as illustrated at 330 in FIG. 3D. Such patterning may be performed via a dry plasma etch 330 using a hard mask 332, for example, resulting in substantially vertical sidewalls, in one embodiment. As illustrated in FIG. 3D, the gate dielectric 312, 314 may also be patterned at this time to expose the source/drain regions 334 of the semiconductor body. Alternatively, however, the gate dielectric may be removed at a later time.

The method 50 of FIG. 2 then continues at 68, 70 and 72, wherein offset spacers, extension region implants, sidewall spacers, and source/drain implants are performed in one embodiment to finish a first part of the transistor structure. For example, as illustrated in FIG. 3E, offset spacers 340 are first formed on lateral edges of the patterned gate electrode 328, followed by extension region implants, wherein the resultant extension regions 342 are self-aligned with respect to the offset spacers. Sidewall spacers 344 are then formed on the offset spacers 340, after which a source/drain implant process 346 is performed to form the source/drain regions 348 in the semiconductor body. As illustrated, the resultant source/drain regions 348 are self-aligned with respect to the offset spacers 344.

The method 50 of FIG. 2 then continues with silicidation at 74, as illustrated at 349 in FIG. 3F, followed by backend processing at 76, wherein contacts are formed down to the completed device through dielectric layers, followed by a plurality of metallization layers, as may be appreciated. In one embodiment of the invention, the silicidation at 74 results in a full silicidation (FUSI) of the gate electrode 328, resulting in structure 350 comprising the fully silicided gate, and silicided source/drain regions 352. For example, in one embodiment a nickel layer having a thickness of about 500 Angstroms is deposited by a suitable process such as sputtering, followed by a first anneal of about 360 C for about 60 seconds to form $Ni_2Si$. The un-reacted nickel is then removed using a wet chemical strip, for example, followed by a second anneal of about 520 C for about 30 seconds to form NiSi.

Figure 4:
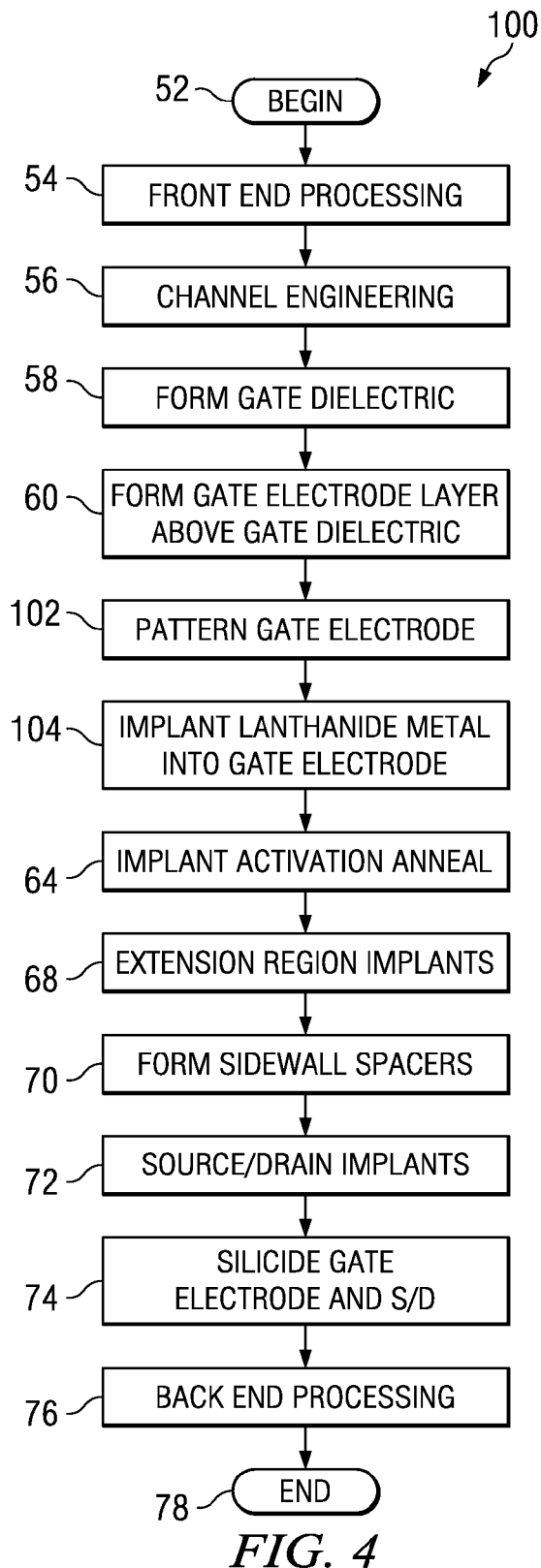
FIG. 4 is a flow diagram illustrating an exemplary method of fabricating a transistor in accordance with another aspect of the present invention.

In accordance with another embodiment of the invention, a method 100 of forming a transistor structure is provided in the flow chart of FIG. 4. In the method 100, front end processing 54, channel engineering 56, gate dielectric formation 58, and gate electrode formation 60 may proceed in a normal fashion, after which the gate electrode is patterned at 102 prior to an incorporation of lanthanide series material therein. After the gate electrode patterning at 102, the lanthanide series metal is incorporated therein, for example, via implantation at 104. In one embodiment of the invention, an implant mask may be employed at 104 to avoid the lanthanide implant from entering one or more undesired areas. The method then continues at 64 with an activation anneal that causes the lanthanide series material to be driven down into the gate dielectric material. Further, in this embodiment the lanthanide series metal enters a top portion of the gate dielectric, but does not extend down to the interface between the gate dielectric and the underlying semiconductor body. The method 100 then continues on in a manner similar to that of FIG. 2.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of forming a transistor, comprising:
   forming a gate dielectric over a semiconductor body, wherein the gate dielectric comprises a lanthanide series material in a top portion thereof; and
   forming a silicon gate electrode over the gate dielectric.

2. The method of claim 1, further comprising fully siliciding the gate electrode.

3. The method of claim 2, wherein fully siliciding the gate electrode comprises:
   forming a nickel layer over the gate electrode; and
   performing one or more thermal processes so as to fully react the silicon of the gate electrode with the nickel layer, thereby causing substantially the entire gate electrode to comprise a nickel silicide.

* * * * *